United States Patent
Bruel

(10) Patent No.: US 8,563,399 B2
(45) Date of Patent: Oct. 22, 2013

(54) DETACHABLE SUBSTRATE AND PROCESSES FOR FABRICATING AND DETACHING SUCH A SUBSTRATE

(75) Inventor: Michel Bruel, Veurey Voroize (FR)

(73) Assignee: Soitec, Bernin (FR)

( * ) Notice: Subject to any disclaimer, the term of this patent is extended or adjusted under 35 U.S.C. 154(b) by 0 days.

(21) Appl. No.: 13/217,928

(22) Filed: Aug. 25, 2011

(65) Prior Publication Data
US 2012/0074526 A1    Mar. 29, 2012

(30) Foreign Application Priority Data
Sep. 29, 2010    (FR) ...................... 10 57852

(51) Int. Cl.
H01L 29/66    (2006.01)
H01L 29/76    (2006.01)
H01L 21/76    (2006.01)
H01L 21/26    (2006.01)

(52) U.S. Cl.
USPC ........... 438/455; 438/162; 438/458; 438/407; 438/514

(58) Field of Classification Search
USPC ........... 257/617, E29.002, E21.347; 438/458, 438/463, 795
See application file for complete search history.

(56) References Cited

U.S. PATENT DOCUMENTS

| | | | |
|---|---|---|---|
| 6,159,323 A | 12/2000 | Joly et al. | 156/241 |
| 6,387,829 B1 | 5/2002 | Usenko et al. | 438/977 |
| 6,995,075 B1 | 2/2006 | Usenko | 438/458 |
| 2004/0222500 A1 | 11/2004 | Aspar et al. | 257/629 |
| 2005/0016837 A1 | 1/2005 | Bruel | 204/192.32 |
| 2008/0038564 A1* | 2/2008 | Bruel | 428/446 |
| 2008/0188060 A1* | 8/2008 | Neyret | 438/458 |
| 2009/0053877 A1* | 2/2009 | Bruel | 438/463 |

FOREIGN PATENT DOCUMENTS

WO   WO 03/060182 A1   7/2003
WO   WO 2004/008514 A1   1/2004

OTHER PUBLICATIONS

Search Report of corresponding French application No. 1057852 mailed Jan. 25, 2011.
Liliental-Weber et al., "Arsenic implantation into GaAs: a SOI technology for compound semiconductors?", Ultramicroscopy, 52(3-4):570-574 (1993).

* cited by examiner

Primary Examiner — Chuong A Luu
Assistant Examiner — Moin Rahman
(74) Attorney, Agent, or Firm — Winston & Strawn LLP

(57) ABSTRACT

The invention relates to a detachable substrate for the electronics, optics or optoelectronics industry, that includes a detachable layer resting on a buried weakened region. This substrate is remarkable in that this buried weakened region consists of a semiconductor material that is denser in the liquid state than in the solid state and that contains in places precipitates of naturally volatile impurities. The invention also relates to a process for fabricating and detaching a detachable substrate.

19 Claims, 4 Drawing Sheets

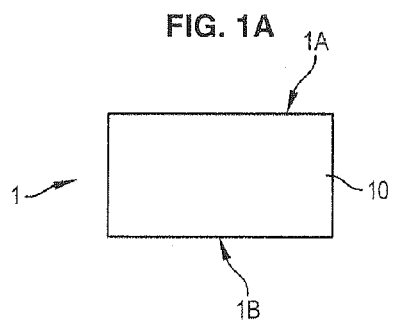
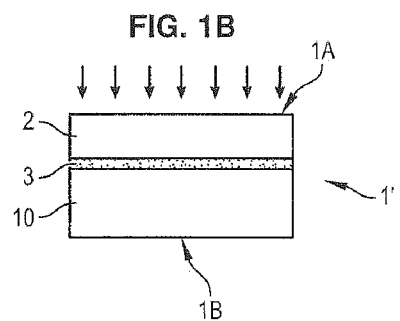
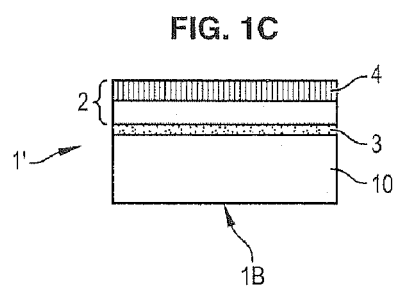
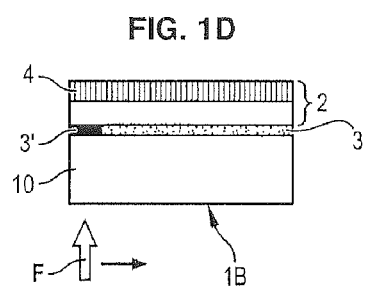
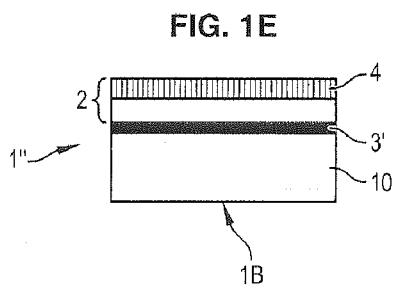

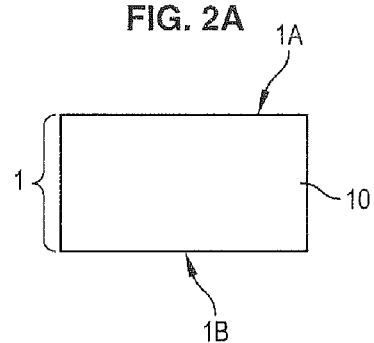
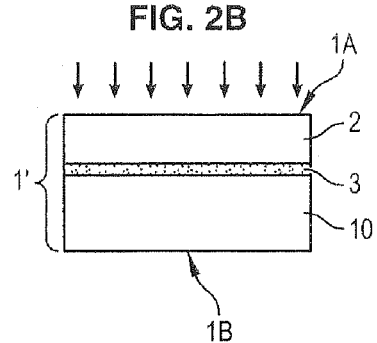
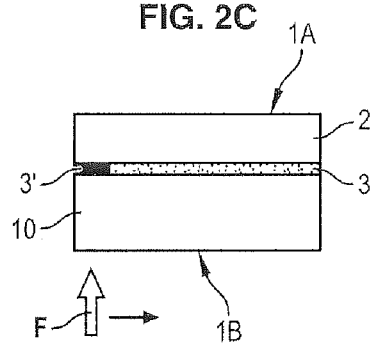
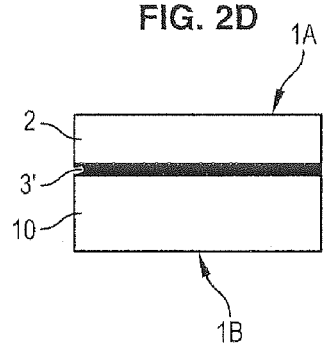
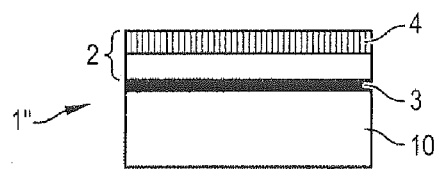

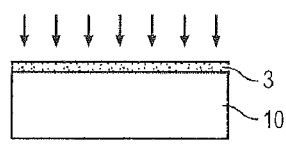
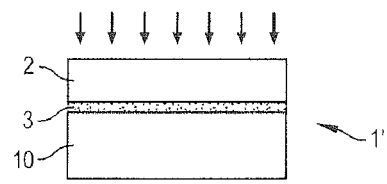
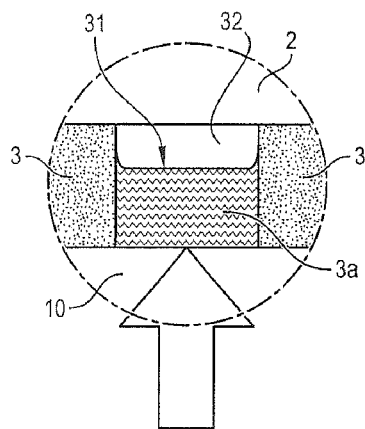
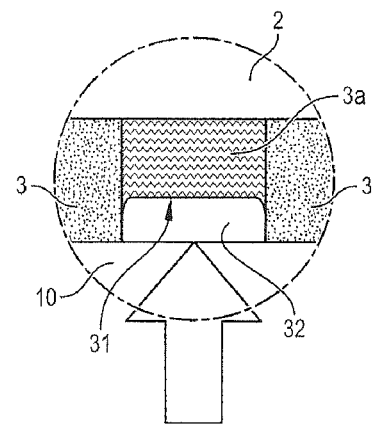
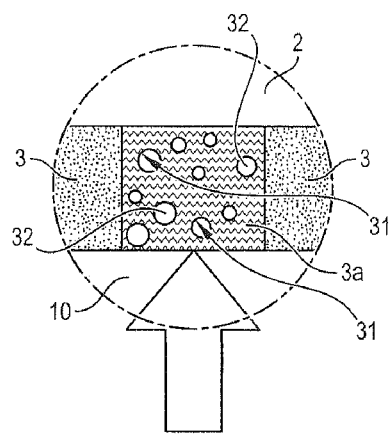

DETACHABLE SUBSTRATE AND PROCESSES FOR FABRICATING AND DETACHING SUCH A SUBSTRATE

FIELD OF THE INVENTION

The present invention relates to a detachable substrate, to its fabrication process and to its detaching process. The detachable substrate includes a detachable layer resting on a buried weakened region. This substrate is remarkable in that this buried weakened region consists of a semiconductor material that is denser in the liquid state than in the solid state and that contains in places precipitates of naturally volatile impurities.

PRIOR ART

Producing a detachable substrate, i.e., a substrate from which it is possible to remove what is called a "detachable" layer having particular properties, is a problem that has existed for a long time in the electronics, optics or optoelectronics industry, especially during component fabrication. Reference may be made for example to document U.S. Pat. No. 6,159,323 (selective transfer of a chip) or document US 2004/222500.

Thus, for example, it would be desirable, at the end of a process for fabricating components in an upper layer, called the "active layer", of a substrate to be able to either completely detach the active layer or selectively detach part of it, such as for example one chip. In this case, the detachable layer includes at least the active layer, though it may even be thicker.

In the following description and claims, the expression "active layer" is understood to mean a layer which comprises partially or in toto components intended for the electronics, optics or optoelectronics industry, and the expression "detachable layer" is understood to mean a layer that can be detached.

This detaching process must meet several criteria: it must not damage the active layer and it must leave the surface of the separated active layer with a finish requiring little or no post-processing.

Preferably, this process must allow the rest of the substrate to be recycled, and it must be as simple and inexpensive as possible.

Various processes have been developed, but none has provided all the expected advantages. Thus, improvements are needed in this area.

SUMMARY OF THE INVENTION

The present invention now provides a detachable substrate and processes for fabricating and detaching it that is an improvement upon the existing art and that provides all of the previously mentioned advantages.

Specifically, the invention provides a detachable substrate, for the electronics, optics or optoelectronics industry, comprising a detachable layer resting on a buried weakened region. This detachable substrate comprises a detachable layer terminating at a buried weakened region made of a semiconductor material that is denser in the liquid state than in the solid state and that contains in places precipitates of naturally volatile impurities. The detachable layer typically includes an active layer of electronic, optical or optoelectronic components, formed therein or thereon. Preferably, the buried weakened region is made of silicon, and that the naturally volatile impurities include arsenic or antimony.

The invention also provides a process for fabricating a detachable substrate which comprises supplying an intermediate substrate comprising a buried weakenable region made of semiconductor material, doped using naturally volatile impurities, which is denser in the liquid state than in the solid state and a detachable layer that extends from the buried weakenable region to a front side of the substrate; and locally melting part or all of the weakenable region for weakening to create at least one free surface between the liquefied material of the weakenable region and a volume of gas, recrystallizing the melted portions to form a weakened region that contains in places precipitates of naturally volatile impurities.

Yet another embodiment of the invention relates to a process for detaching a detachable layer from a detachable substrate of the invention by bonding a receptor substrate to at least part of the free surface of the detachable layer; and applying mechanical or thermal stresses in an amount sufficient to detach the detachable layer along the buried weakened region from the rest of the substrate.

BRIEF DESCRIPTION OF THE DRAWINGS

Other objects, features and advantages of the invention will be better understood in light of the following detailed description, given with reference to the appended drawings in which:

FIGS. 1A to 1E show the various steps in one method of fabricating a detachable substrate according to the invention;

FIGS. 2A to 2E show the various steps in another method of fabricating a detachable substrate according to the invention;

FIGS. 3A and 3B show the first two steps in yet another method of fabricating a detachable substrate according to the invention;

FIGS. 4, 5 and 6 are enlarged, detailed views of the weakened region of the detachable substrate, these figures showing examples of the various physical effects that occur during the weakening step using a laser beam;

DETAILED DESCRIPTION OF THE INVENTION

Figure 7A:
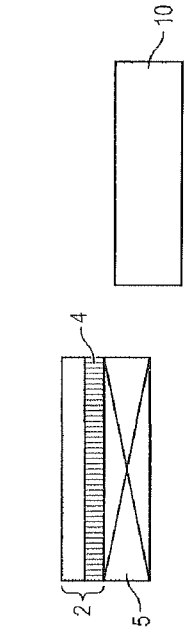
FIGS. 7A and 7B show successive steps in a first method of implementing the process for detaching the detachable substrate.

According to the invention, the buried weakened region is a semiconductor material that is denser in the liquid state than in the solid state and that contains in places precipitates of naturally volatile impurities.

According to other features of the invention, taken individually or in combination:

this substrate comprises an active layer of electronic, optical and/or optoelectronic components, formed in and/or on the detachable layer; and the buried weakened region is made of silicon, and the naturally volatile impurities are chosen from arsenic and antimony.

The invention also relates to a process for fabricating a detachable substrate. It comprises steps consisting in:

a) supplying what is called an "intermediate" substrate that comprises a buried weakenable region made of semiconductor material, doped using naturally volatile impurities, which is denser in the liquid state than in the solid state and a detachable layer that extends between this buried weakenable region and one of the sides, called the "front" side, of this substrate; and b) locally melting all of the weakenable region, or part of the latter, so as to create at least one free surface between the liquefied material of the weakenable region and a volume of gas, then letting this region recrystallize so as to form what is called a "weakened" region that contains in places precipitates of naturally volatile impurities.

According to other features of this process, taken individually or in combination:

the buried weakenable region is formed by implanting the naturally volatile impurities within the semiconductor layer that is denser in the liquid state than in the solid state;

the buried weakenable region and the detachable layer are formed by epitaxial deposition;

the localized melting step b) is repeated at least once;

it also comprises a step consisting in forming an active layer of electronic, optical and/or optoelectronic components in and/or on the detachable layer;

the active layer is formed after the melting step;

the active layer is formed before the melting step;

the weakenable region is made of silicon and the naturally volatile impurities implanted are chosen from arsenic and antimony;

the dose of naturally volatile impurities implanted lies between $10^{15}$ and $10^{17}$ at/cm$^2$;

the thickness of the weakened region lies between 100 nm (100 nanometres) and 10 μm (10 microns);

the buried weakenable region is more absorbent with respect to infrared radiation than the rest of the intermediate substrate and step b) comprises applying infrared radiation;

the radiation is applied by means of an infrared laser; and the infrared treatment is applied for a period lying between 10 ns (10 nanoseconds) and 10 μs (10 microseconds).

Finally, the invention relates to a process for detaching the aforementioned detachable substrate. It comprises steps consisting in:

bonding a receptor substrate to at least part of the free surface of the detachable layer; and applying mechanical and/or thermal stresses, so as to detach the detachable layer from the rest of the substrate along the buried weakened region.

With regard to FIGS. 1A to 1E, a first method of implementing a process for fabricating a detachable substrate according to the invention will now be described.

With regard to FIG. 1A, an initial substrate 1 is shown that has a layer that it is desired to detach.

This substrate 1 has a front side 1A, which corresponds to the side of the substrate on which the detachable layer will be formed, and a back side 1B, which is opposite the front side 1A.

In the embodiment shown in FIGS. 1A and 2A, the initial substrate 1 consists of a single layer of material, called the "initial layer 10". This is called a bulk substrate.

In accordance with the invention, this initial layer 10 is made of a material chosen from semiconductors that are less dense in the solid state than in the liquid state. Thus, they occupy more space when solid that when liquid. Mention is made, for example, of silicon and germanium.

The initial layer 10 may optionally be doped n-type or p-type or undoped.

As a variant, not shown in the figures, the initial substrate 1 may also be a multilayer substrate, provided that it comprises a layer of a semiconductor, forming the initial layer 10, which is less dense in the solid state than in the liquid state.

With reference to FIG. 1B, a first step of the process comprises introducing, by ion implantation, into the initial layer 10, what are called "naturally volatile" impurities.

Preferably, after this implantation, the initial layer 10 is annealed (typically at about 1000° C. for an hour) so as to restore the crystallinity of the layer and make the naturally volatile impurities electrically active if the latter are dopants.

The expression "naturally volatile impurities" is understood to mean, in the following description and claims, impurities that have a vapor pressure that increases rapidly as a function of temperature, i.e. impurities that have a vapor pressure of at least 100 pascals at a temperature of 900° C. or below.

Moreover, thermal diffusion lengths of these naturally volatile impurities in the semiconductor, which forms the initial layer 10, in the solid state are preferably small compared to the thickness of this layer 10. Thus, during the heat treatments required for fabricating components (which will be described below) on the substrate, the distance travelled by these impurities is small.

It should also be noted that if the sum of thermal budget for annealing the implanted layer and thermal budget for fabricating the components is equivalent to applying a temperature T (expressed in degrees Celsius) for a time t (expressed in seconds) and the thickness of the initial layer 10 is E, then the following relationship must be respected:

$$\sqrt{D.t} \leq E$$

where D represents thermal diffusion coefficient of the naturally volatile impurities implanted in a given material.

By way of example, if the sum of the aforementioned thermal budgets is equivalent to applying a temperature of 1100° C. for 2 hours, i.e. 7200 seconds, and E is equal to 2 μm, it is then necessary for:

$$\sqrt{D.t} \leq 2 \times 10^{-4} \text{ cm}$$

i.e.:

$$D \leq 5.5 \times 10^{-12} \text{ cm}^2/s$$

Tables of thermal diffusion coefficients of arsenic and antimony show that at 1100° C. these diffusion coefficients in silicon are of the order of $1 \times 10^{-14}$ cm$^2$/s. The above relationship is therefore indeed respected.

Thus, during the heat treatments needed to subsequently fabricate components for the electronics, optics or optoelectronics industry, these naturally volatile impurities do not migrate or migrate only a small amount.

As a consequence, in the case where the initial layer 10 is made of silicon, the impurities are advantageously chosen from arsenic (As) and antimony (Sb), whether individually or combined together, antimony being less volatile than arsenic but less prone to diffuse through the silicon.

Preferably, these impurities are implanted with a dose lying between $10^{15}$ and $10^{17}$ at/cm$^2$.

After this implantation step and the optional thermal anneal step, the naturally volatile impurities are distributed inside what is called a "weakenable" region 3.

If these impurities are implanted with sufficient energy, the weakenable region 3 is located at a certain depth in the initial layer 10 and bounds, with the front side 1A, a detachable layer 2.

If the opposite is the case, these impurities may also be located level with the front side 1A or at a very small depth inside the layer 10. In these two cases, the detachable layer 2 is formed either entirely by epitaxy or made thicker by epitaxy.

Another possible way of fabricating the intermediate substrate 1' will now be described with reference to FIGS. 3A and 3B.

In this case an initial layer 10 is used on which a layer 3 of a single-crystal semiconductor that is less dense in the solid state than in the liquid state has already been deposited.

This layer 3 is then doped with naturally volatile impurities, as described above, so as to form the weakenable region 3.

Finally, the detachable layer 2 is deposited, also by epitaxy, on the weakenable region 3 (see FIG. 3B).

This technique makes it possible to obtain, if it is desired, an initial layer 10 and a layer 3 made of different materials.

Whatever the implementation variant used to form the weakenable region 3, its thickness preferably lies between 100 nm and 10 µm.

A substrate, called an "intermediate" substrate and given the reference 1', is thus obtained.

Although not shown in the figures, it is noted that this weakenable region 3 could optionally be formed only on part of the layer 10, provided that impurities are introduced only into part of the layer 3.

As may be seen in FIG. 1C, electronic, optical or optoelectronic components are then formed using deposition, lithography, etching, and heat treatment steps well known to a person skilled in the art and which will not be described in greater detail here.

These components are formed in or on the detachable layer 2.

Thus a layer of components, called an "active layer" 4, is obtained, which may extend over the whole of the front side 1A (as shown in FIG. 1C) or over only some of the latter.

Then, as shown in FIG. 1D, a treatment is carried out so as to convert the weakenable region 3 into a weakened region 3'.

To do this, a light flux is applied via the back side 1B of the substrate 1, for example by means of a laser beam F.

The choice of the laser and its properties is governed by the following criteria:
  its wavelength must be such that the light flux is not absorbed before reaching the weakenable region 3, but it must however be selectively absorbed in this region 3;
  the pulse length must be such that energy transfer is substantially adiabatic, i.e. there is no or almost no heat exchange with the materials forming the layers 2 and 10 located on either side of the weakenable region 3.

If this is so, then the inequality $\sqrt{D.t}<Ef$ is respected, where D is thermal diffusion coefficient, τ is the laser pulse length and Ef is the thickness of the weakenable region 3.

Thus, by way of example, for a high-temperature thermal diffusion coefficient in silicon of 0.1 cm$^2$/s, and for a region 3 having a thickness of 1 µm, the laser pulse length τ must be less than $100 \times 10^{-9}$ s, (100 nanoseconds).

the energy density of the pulse must be sufficient to locally melt, i.e. in the region treated with the laser beam, the entire thickness of the weakenable region 3.

By way of purely illustrative example, in the case where the substrate 1 is made of silicon and the weakenable region 3 contains antimony (Sb) impurities, an infrared laser is chosen (for example a $CO_2$ laser).

It should be noted that the melting effect may also extend slightly beyond the weakenable region 3, at either side, for example into the detachable layer 2 or into the initial layer 10 (i.e. beneath the weakenable region 3).

The material forming the layer 3 has the particularity of being less dense in the solid state than in the liquid state. By way of example, silicon has a density in the liquid state of about 2.57 which is approximately 10% greater than its density in the solid state (about 2.33).

Thus, the material present in the weakenable region 3 occupies more space when solid than when liquid.

The liquefaction of the buried weakenable region 3 thus leads to the appearance of a free volume, i.e., a volume that is not filled with a solid or liquid phase, and correspondingly to the formation of at least one internal free surface of the liquid phase of the melted material.

The free surface thus created may have multiple forms, three examples of which are illustrated in FIGS. 4 to 6.

In the variant shown in FIG. 4, the liquefied material in the weakenable region 3 (referenced 3a) makes contact with the initial layer 10 and non-liquefied portions of the weakenable region 3 located on either side. It moreover has an internal free surface 31 directed towards the top of FIG. 4, i.e. facing the detachable layer 2. The free volume 32 extends between this free surface 31 and the detachable layer 2.

FIG. 5 shows the inverse situation, in which the liquefied material 3a makes contact with the detachable layer 2 and non-liquefied portions of the weakenable region 3, but does not make contact with the initial layer 10. The free volume 32 then extends between the free surface 31 and the layer 10.

Finally, FIG. 6 shows a situation in which there are several free volumes 32, distributed, in the form of bubbles, within the liquefied material 3a.

Inside the liquefied material portion 3a, the naturally volatile impurities contained in the layer 3 in the solid state escape through the free surface(s) 31 towards the free volume(s) 32 which is (are) created. This free volume 32 contains gas.

When the laser beam is removed, the liquefied material 3a recrystallizes.

However, during the cooling of the material, there is not enough time for the naturally volatile impurities to be completely reincorporated into the recrystallized material. They therefore remain trapped in the final position of the free surface 31 of the material 3a, as it disappears because of its resolidification, or next to this position.

In other words, these naturally volatile impurities are trapped at the interface or interfaces between the recrystallized material in the weakenable region 3 and the detachable layer 2, or between the region 3 and the initial layer 10, or even inside the weakenable region 3. Thus, the concentration of naturally volatile impurities is greater, at least in places, than the solubility limit of these impurities in the material in the region 3, thereby leading to their precipitation over a thickness of a few atomic layers.

Therefore defects, consisting of concentrated impurities, are formed in places, taking the form, for example, of precipitates inserted in the crystal lattice. This deforms the lattice and places it under stress.

The presence, after recrystallization, of these impurities in the form of precipitates, in the weakenable region 3 or nearby, thus leads to the formation, around these precipitates, of secondary crystal defects, such as dislocations, dislocation loops, fracture initiators, stacking faults, or else clusters of vacancies. The presence of precipitates and these secondary defects weakens this region 3 and makes detachment of the detachable layer 2 easier, for example by means of mechanical and/or thermal stresses, as described below.

For the sake of concision, the expression "precipitates of naturally volatile impurities" is understood to mean all the defects resulting from the trapping of impurities in free volumes 32 that disappear during resolidification. As described above, this denomination therefore comprises the precipitates themselves and the induced secondary defects, all of which contribute to the providing stress to the layer to create weakness which facilitates detachment of the detachable layer.

By way of example, when the initial substrate 1 is made of silicon, thermal diffusion coefficient of the antimony or arsenic impurities in the liquid silicon is of the order of $10^{-14}$ cm$^2$/s.

For a recrystallization time of about a microsecond and an initial impurity concentration of about $10^{20}$ cm$^3$, about $10^{15}$ impurities per cm$^2$ remain trapped at the aforementioned interface 31 during resolidification.

This very high impurity concentration, higher than $10^{15}$ at/cm$^2$ in a thickness of a few atomic layers, corresponds to a concentration per unit volume that may reach on average a few $10^{21}$ at/cm$^3$, which is above the solubility limit of these impurities. Consequently, this results in a weakening of the region 3 which becomes a weakened region 3'.

The light flux is applied locally to an area corresponding to the dimensions of the laser beam, either in the form of pulses, or in the form of a continuous laser flux that is swept over all or some of the back side 1B of the substrate, so as to weaken the area required.

It is thus possible to treat the entire area of the substrate for complete transfer of the detachable layer 2. It is also possible to treat a smaller area, so as subsequently to transfer only part of the detachable layer 2, such as for example one chip.

The light treatment may also be repeated several times, if necessary, so as to increase in succession the impurity density and obtain the desired degree of weakening, so as to make the detachment of the detachable layer 2 easier. The impurities that evaporate from the liquid phase come from only a small thickness beneath the surface, of the order of the liquid-phase diffusion length. Thus the number of impurities is limited. If the laser treatment operation is repeated several times the number of impurities extracted from the liquid phase is increased.

Moreover, it should be noted that the heating induced by the melting of the weakenable region 3 is transitory, it has no thermal effect on the active layer 4. The performance of the components of this layer is therefore not affected.

The detachable substrate thus obtained, which includes the weakened region 3', has been given the reference 1".

A third method of implementing a process for fabricating a detachable substrate according to the invention will now be described with regard to FIGS. 2A to 2E. Elements that are identical to those shown in FIGS. 1A to 1E have been given the same reference numbers and will not be described again.

This third method of implementation differs from the first in that the active layer 4 of components is formed not only after the weakenable region 3 has been formed, but also after it has been converted to a weakened region 3'. The other steps are identical.

Thus, the laser treatment may be applied to the front side 1A or the back side 1B, irrespectively, with no risk of damaging the components and above all without the latter obstructing the path of the light beam.

Finally, according to another implementation (not shown in the figures), it is also possible to form the active layer 4 on the front side 1A, before forming the weakenable region 3.

It is also possible to envisage applying the laser treatment before and after the components have been fabricated, all of these treatments contributing to weakening the substrate in the weakenable region 3.

The detachment of the detachable substrate will now be described in more detail, with reference to FIGS. 7A to 8B.

According to a first implementation variant illustrated in FIG. 7A, a receptor substrate 5 is applied to the active layer 4 of the detachable substrate 1", by direct bonding or using any other method that makes it possible to securely fasten the receptor substrate 5 to the active layer 4.

Next, mechanical stresses are applied to the multilayer thus formed, on either side of the weakened region 3' or to the latter, for example shear forces applied, using a jet of fluid or a blade, to the weakened region 3'. It is also possible to apply thermal stresses.

Figure 7B:
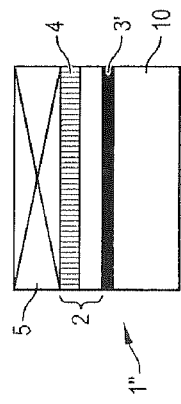

The detachable layer 2, which includes the active layer 4, is thus transferred to the receptor substrate 5, as illustrated in FIG. 7B.

Figure 8A:
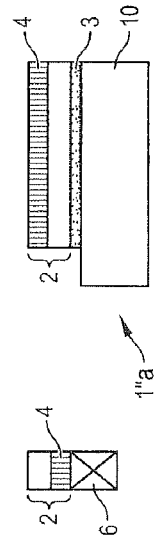
FIGS. 8A and 8B show successive steps in a second method of implementing the detaching process.
Figure 8B:
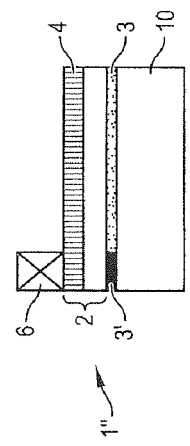

According to a second implementation variant illustrated in FIG. 8A, a receptor substrate 6 that is smaller than the detachable substrate 1" is applied, so as to detach only part of the detachable layer 2 using bonding and detachment principles that are the same as those described above. It is thus possible to detach a single component as required (for example a single chip).

If, as shown in FIG. 8A, only some of the weakenable region 3 has been weakened, the laser beam is then applied to the rest 1"$a$ of the detachable substrate, so as to weaken either some of the region 3, or all of it.

It is then possible to apply a second receptor substrate to the rest of the detachable substrate 1"$a$ and either continue to detach a second component, and then repeat this operation until all of the components have been removed from the active layer 4, or continue to detach all of the rest of the detachable layer.

By virtue of this detaching process, the components of the active layer 4 are transferred without being damaged and the detachable layer 2 requires no or little post-detachment processing.

This process may be employed very flexibly because the detachment may be adjustable in nature.

Finally, it is possible to recycle the rest of the initial substrate, for example for use in the fabrication of a detachable substrate, as described above.

Example

An example of the method of implementating the process for fabricating a detachable substrate now follows.

A layer 10 of lightly doped ($10^{15}$/cm$^3$) n-type silicon was used as an initial substrate. A weakenable region 3 made of single-crystal silicon 3 µm in thickness and highly doped with antimony (Sb) (for example doped with $2 \times 10^{19}$ at/cm$^3$), was formed on top by epitaxy.

Finally, a detachable layer 2 made of lightly n-type doped silicon having the same area as the initial substrate was formed, also by epitaxy, this layer being 5 µM in thickness.

Next, a pulsed $CO_2$ laser spot delivering 3 J/cm$^2$ of energy for about one hundred nanoseconds was applied to the back side 1B, the spot possibly having a diameter of about 200 µm to 500 µm.

The area of the substrate was irradiated several times, the substrate being given time to cool between two irradiations, for example for a period of a few tens of milliseconds.

After this step of weakening the region 3, components were formed in or on the detachable layer 2.

Finally, the detachable layer 2 and the components were detached by applying a receptor substrate 5 to the front side of the substrate 1, i.e. the side bearing the components, and then by applying mechanical forces to the weakened region. The detachable layer 2 was thus transferred to the receptor substrate.

What is claimed is:

1. A process for fabricating a detachable substrate which comprises:

supplying an intermediate substrate comprising a buried weakenable region made of semiconductor material, doped using naturally volatile impurities, which is denser in the liquid state than in the solid state and a detachable layer that extends from the buried weakenable region to a front side of the substrate, with the naturally volatile impurities having a vapor pressure of at least 100 pascals at temperatures of 900° C. or below and a thermal diffusion length that is small compared to that provided by the thickness of the intermediate substrate;

locally melting part or all of the weakenable region, including at least part of the volatile impurities, to create at least one free surface containing a volume of gas at an interface between the liquefied material of the weakenable region and adjacent substrate material; and recrystallizing the melted portions to form a weakened region that contains in places precipitates of the naturally volatile impurities at the interface.

2. The process according to claim 1, wherein the buried weakenable region is formed by implanting naturally volatile impurities of arsenic within the semiconductor layer.

3. The process according to claim 1, wherein the buried weakenable region and the detachable layer are formed by epitaxial deposition.

4. The process according to claim 1, wherein the localized melting step is repeated at least once to melt additional portions of the weakenable region.

5. The process according to claim 1, which further comprises forming an active layer of electronic, optical or optoelectronic components in or on the detachable layer.

6. The process according to claim 5, wherein the active layer is formed after the local melting.

7. The process according to claim 5, wherein the active layer is formed before the local melting.

8. The process according to claim 2, wherein the weakenable region is made of silicon.

9. The process according to claim 8, wherein the dose of naturally volatile impurities to be implanted lies between $10^{15}$ and $10^{17}$ at/cm$^2$.

10. The process according to claim 1, which further comprises providing the weakened region at a thickness between 100 nm and 10 µm.

11. The process according to claim 1, wherein the intermediate substrate comprises a multilayer structure.

12. The process according to claim 1, which further comprises providing the buried weakenable region to be more absorbent with respect to infrared radiation than the rest of the intermediate substrate and that the local melting is achieved by applying infrared radiation.

13. A process for fabricating a detachable substrate which comprises:

supplying an intermediate substrate comprising a buried weakenable region made of semiconductor material, doped using naturally volatile impurities, which is denser in the liquid state than in the solid state and a detachable layer that extends from the buried weakenable region to a front side of the substrate, with the naturally volatile impurities having a vapor pressure of at least 100 pascals at temperatures of 900° C. or below and a thermal diffusion length that is small compared to that provided by the thickness of the intermediate substrate;

locally melting part or all of the weakenable region, including at least part of the volatile impurities, by applying infrared radiation to create at least one free surface containing a volume of gas at an interface between the liquefied material of the weakenable region and adjacent substrate material, wherein the radiation is applied by an infrared laser; and recrystallizing the melted portions to form a weakened region that contains in places precipitates of the naturally volatile impurities at the interface.

14. The process according to claim 11, wherein the infrared treatment is applied for a period of 10 ns to 10 µs, and the naturally volatile impurities include arsenic- or antimony.

15. A process for detaching a detachable layer from a detachable substrate fabricated according to the process of claim 1; which comprises:

bonding a receptor substrate to at least part of the free surface of the detachable layer; and applying mechanical or thermal stresses in an amount sufficient to detach the detachable layer along the buried weakened region from the rest of the substrate.

16. The process according to claim 15, which further comprises forming an active layer of electronic, optical or optoelectronic components in or on the detachable layer.

17. The process according to claim 15, wherein the buried weakened region is made of silicon, and that the naturally volatile impurities include arsenic or antimony.

18. The process according to claim 15, which further comprises providing the intermediate structure as part of a multilayer structure.

19. The process according to claim 1, which further comprises:

bonding a receptor substrate to at least part of a free surface of the detachable layer; and applying mechanical or thermal stresses in an amount sufficient to detach the detachable layer along the buried weakened region from the rest of the substrate.

* * * * *